United States Patent
Giannini et al.

(10) Patent No.: US 10,718,852 B2
(45) Date of Patent: Jul. 21, 2020

(54) RF/MM-WAVE PEAK DETECTOR WITH HIGH-DYNAMIC RANGE CALIBRATION

(71) Applicant: Texas Instruments Incorporated, Dallas, TX (US)

(72) Inventors: Vito Giannini, Irving, TX (US); Brian Paul Ginsburg, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 514 days.

(21) Appl. No.: 14/921,475

(22) Filed: Oct. 23, 2015

(65) Prior Publication Data
US 2017/0115377 A1  Apr. 27, 2017

(51) Int. Cl.
*G01S 7/40*     (2006.01)
*G01S 13/931*   (2020.01)
(Continued)

(52) U.S. Cl.
CPC ............ *G01S 7/4004* (2013.01); *G01R 19/04* (2013.01); *G01R 21/12* (2013.01); *G01S 7/032* (2013.01); *G01S 7/35* (2013.01); *G01S 7/4017* (2013.01); *G01S 13/931* (2013.01); *G01S 2013/93271* (2020.01); *G01S 2013/93272* (2020.01); *G01S 2013/93274* (2020.01)

(58) Field of Classification Search
CPC ....... G01S 7/4004; H04B 17/00; G01R 21/10; G01R 21/12; G01R 31/27; G01R 31/275; G01R 31/2632; G01R 31/2635
USPC ......................................................... 342/174
See application file for complete search history.

(56) References Cited

U.S. PATENT DOCUMENTS

| 6,762,627 B1* | 7/2004 | Gater ..................... G01R 19/04 327/337 |
| 2007/0004359 A1* | 1/2007 | Srinivasan ........... H03G 3/3068 455/232.1 |

(Continued)

FOREIGN PATENT DOCUMENTS

| CN | 104316755 A | 1/2015 |
| EP | 3058380 B1 | 7/2019 |
| WO | 2015056055 | 4/2015 |

OTHER PUBLICATIONS

Pedro Fonseca da Mota , "A True Detector for RF PA Built-In Calibration and Testing". (Year: 2011).*

(Continued)

*Primary Examiner* — Vladimir Magloire
*Assistant Examiner* — Helena H Seraydaryan
(74) *Attorney, Agent, or Firm* — Ebby Abraham; Charles A. Brill; Frank D. Cimino (57) ABSTRACT

An integrated circuit (IC) is provided with a plurality of diode based mm-wave peak voltage detectors (PVD)s. During a testing phase, a multi-point low frequency calibration test is performed on one or more of the PVDs to determine and store a set of alternating current (AC) coefficients. During operation of the IC, a current-voltage sweep is performed on a selected one of the PVDs to determine a process and temperature direct current (DC) coefficient. A peak voltage produced by the PVD in response to a high frequency radio frequency (RF) signal is measured to produce a first measured voltage. An approximate power of the RF signal is calculated by adjusting the first measured voltage using the DC coefficient and the AC coefficient.

20 Claims, 9 Drawing Sheets

(51) Int. Cl.
G01R 19/04 (2006.01)
G01S 7/03 (2006.01)
G01S 7/35 (2006.01)
G01R 21/12 (2006.01)

(56) References Cited

U.S. PATENT DOCUMENTS

2011/0057712 A1* 3/2011 Bowers ............. H01P 1/127
327/419
2013/0021048 A1 1/2013 Peng et al.
2016/0025808 A1* 1/2016 Singh ............. G01R 31/3177
714/733

OTHER PUBLICATIONS

Berenc, "RF Diode Peak Detector Calibration For the CKM SCRF Q-Measurement System". (Year: 2002).*
Sudheer Kumar Reddy Gangula, "In-field Built-in Self-test for Measuring RF Transmitter Power and Gain". (Year: 2015).*
Glen Leinweber, "Square Law Diode Detectors in 50 ohm Systems", Radio Astronomy Supplies Application Note 6, Square Law Detectors, May 2001, pp. 1-3.
Steven M. Bowers et al, "Integrated Self-Healing for mm-Wave Power Amplifiers", IEEE Transactions on Microwave Theory and Techniques, vol. 61, No. 3, Mar. 2013, pp. 1301-1315.
Nicolas Barabino and Fernando Silveira, "Digitally Assisted CMOS RF Detectors With Self-Calibration for Variability Compensation", IEEE Transactions on Microwave Theory and Techniques, vol. 63, No. 5, May 2015, pp. 1676-1682.
Sang Young Kim et al, "A 76-84-GHz 16-Element Phased-Array Receiver With a Chip-Level Built-In Self-Test System", IEEE Transactions on Microwave Theory and Techniques, vol. 61, No. 8, Aug. 2013, pp. 3083-3098.
Brecht Francois and Patrick Reynaert, A Transformer-Coupled True-RMS Power Detector in 40nm CMOS, IEEE International Solid-State Circuits Conference 2014, Session 3, RF Techniques 3.3, Feb. 10, 2014, San Francisco, CA, pp. 1-3.
CN104316755A, First Office Action Issued by China National Intellectual Property Administration and Translation; dated Nov. 13, 2019.
T Berenc: "RF Diode Peak Detector Calibration for the CKM SCRF Q-Measurement System", Jul. 18, 2002 (Jul. 18, 2002), XP0585814528, Retrieved from the Internet: URL: http://www-bd.fnal.gov/3.9GHz_Scrf/RFI.
Da Mota P F, et al. "A true Power Detector for RF PA Built-In Calibration and Testing", Design, Automation & Test In Europe Conference & Exhibition (date), 2011, IEEE, Mar. 14, 2011 (Mar. 14, 2011), pp. 1-6. XP032318155, DOI: 10.1109/DATE. 2011. 5763064, ISBN: 978-1-61284-208-0.
Supplementary European Search Report, Application/Patent: EP 16 85 8444.9-1206/3365691 PCT/US2016058489, 15 pages, dated Oct. 23, 2018.

* cited by examiner

RF/MM-WAVE PEAK DETECTOR WITH HIGH-DYNAMIC RANGE CALIBRATION

FIELD OF THE INVENTION

Embodiments of the present disclosure generally relate to wireless transceiver systems, and more specifically relate to measurement of transceiver performance parameters in systems that must comply with strict functional requirements.

BACKGROUND OF THE INVENTION

A new class of safety systems, referred to as advanced driver assistance systems (ADAS), has been introduced into automobiles to reduce human operation error. These systems are enabled by smart sensors based primarily on millimeter-wave automotive radars. The proliferation of such assistance systems, which may provide functionality such as rear-view facing cameras, electronic stability control, and vision-based pedestrian detection systems, has been enabled in part by improvements in microcontroller and sensor technologies. Enhanced embedded radar-based solutions are enabling complementary safety features for ADAS designers.

In an automotive radar system, one or more radar sensors may be used to detect obstacles around the vehicle and the speeds of the detected objects relative to the vehicle. A processing unit in the radar system may determine the appropriate action needed, e.g., to avoid a collision or to reduce collateral damage, based on signals generated by the radar sensors. Current automotive radar systems are capable of detecting objects and obstacles around a vehicle, the position of any detected objects and obstacles relative to the vehicle, and the speed of any detected objects and obstacles relative to the vehicle. Via the processing unit, the radar system may, for example, alert the vehicle driver about potential danger, prevent a collision by controlling the vehicle in a dangerous situation, take over partial control of the vehicle, or assist the driver with parking the vehicle.

Automotive radar systems are required to meet the functional safety specifications of International Standard 26262 titled "Road Vehicles—Functional Safety." ISO 26262 defines functional safety as the absence of unreasonable risk caused by malfunctioning behavior of electrical/electronic systems. Functional safety in automotive radar is the prevention of harm to humans due to failure of components in the radar. For automotive radar, the radar should be known to be functioning appropriately within a fault tolerant time interval of approximately 100 milliseconds (ms). Thus, while the vehicle is operating, a failure in any part of the radar that would lead to a degraded signal-to-noise ratio (SNR) should be detected, and an appropriate response performed within approximately 100 ms.

BRIEF DESCRIPTION OF THE DRAWINGS

Particular embodiments in accordance with the invention will now be described, by way of example only, and with reference to the accompanying drawings.

Other features of the present embodiments will be apparent from the accompanying drawings and from the detailed description that follows.

DETAILED DESCRIPTION OF EMBODIMENTS OF THE INVENTION

Specific embodiments of the invention will now be described in detail with reference to the accompanying figures. Like elements in the various figures are denoted by like reference numerals for consistency. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Throughout their lifecycle, automotive radars need to self-diagnose and assess risks due to malfunctions in order to comply with safety standards such as the ISO 26262. A built in self test (BIST) network is disclosed herein that checks performance degradation in the field. Embodiments of the disclosure provide multifold benefits including: means for failure mode detection, digitally assisted performance adaptation, and a significant reduction in the radio frequency (RF) test costs, which may account for up to 30% of the cost of a mass-produced mm-wave product.

Figure 1:
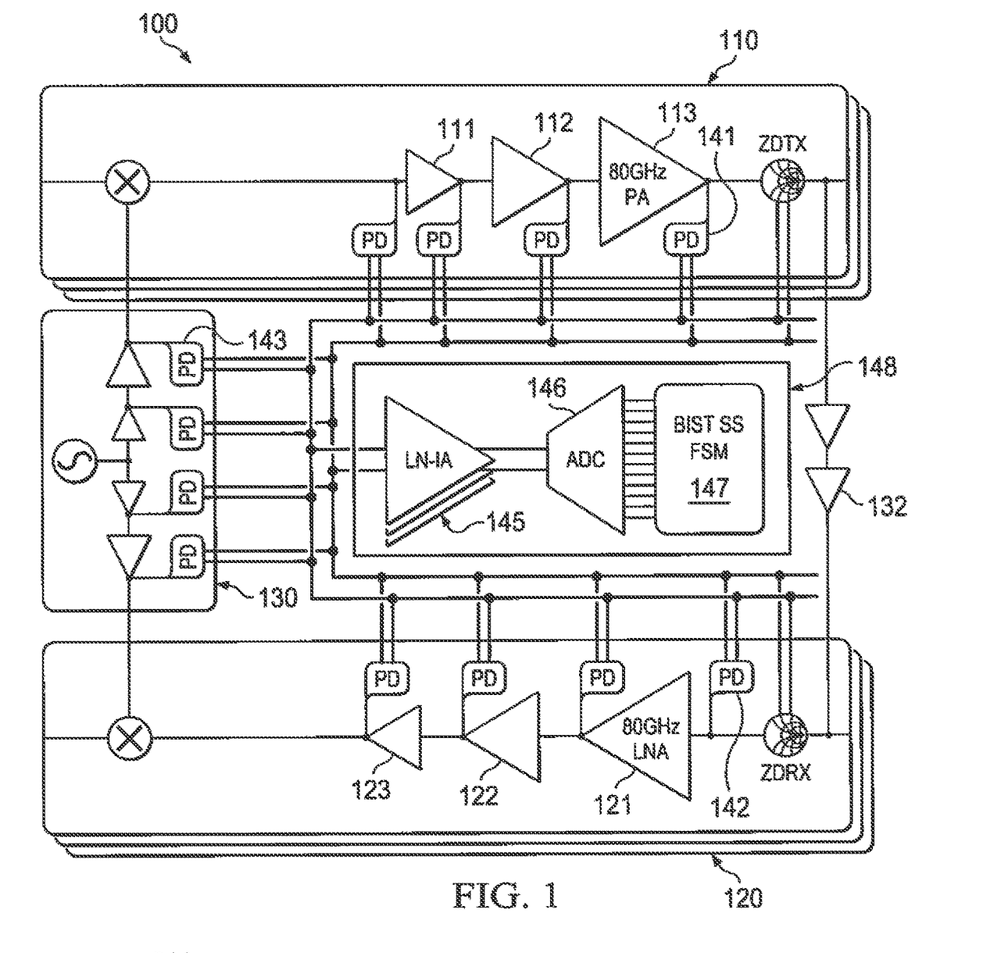
FIG. 1 is a block diagram of a radar system that may be used for automotive driver assistance applications.

FIG. 1 is a block diagram of an example radar system 100 that may be used for automotive driver assistance applications. In this example, there may be multiple RF transmitters (TX) 110, multiple RF receivers (RX) 120, RF signal synthesizer circuit 130, RF loop back 132, etc. Each RF transmitter 110 may include a chain of amplifiers 111, 112 and a power amplifier (PA) 113, for example. Each receiver 120 may include a low noise amplifier (LNA) 121 and a chain of amplifiers 122, 123. The general operation of radar systems is well known and need not be described in detail herein. In this example, the radar system operates in the 79-81 GHz range; however, in other embodiments a higher or lower operating frequency may be used.

Typically, the highest failure rates in an ADAS are within the high-swing mm-wave blocks illustrated in system 100; therefore a set of peak detectors (PD), such as 141, 142, 143 are provided to closely monitor the voltage swings at the output of most or all of the RF amplifiers within the each transmitter 110, LO (local oscillator) signal distribution, the front-end of each receiver 120, and each TX-RX 132 loop-back path. These low-complexity peak-detectors are allocated at tens of mm-wave nodes within system 100 while providing negligible impact on RF performance and area. Impedance Detectors (ZDTX, ZDRX) that sense variations in the reflection coefficient and output power may be placed at each antenna port to measure relative output/input impedances variations that may indicate package issues.

The BIST network 148 may be coupled to monitor the set of PDs (141-143, etc.) and may include one or more low-frequency front-ends made of low-noise instrumentation amplifier(s) 145 that maximizes the dynamic range at the input of a successive approximation register (SAR) analog to digital converter (ADC) 146. A BIST Sub-System Finite-State-Machine (FSM) 147 controls the BIST network. Functional safety may be built around a lockstep processor (not shown) as digital safe island targeting a Single Point Fault Metric (SPFM) for all analog functions higher than 90%, which is a key requirement for ASIL-B systems.

Peak-Detectors

Sensing voltage at 79 GHz can be a very challenging task, especially to achieve wide test coverage over multiple RF blocks. A capacitive loading of a few femtofarads may introduce impedance mismatches and therefore unacceptable losses. Additionally, as such functional-safety features can be typically allocated only when the RF design and layout are in an advanced stage, a tight area requirement may limit the degrees of freedom on the PD design. Accuracy and precision of the PDs may enable a suite of on-chip RF tests and therefore provide cost savings.

Figure 2:
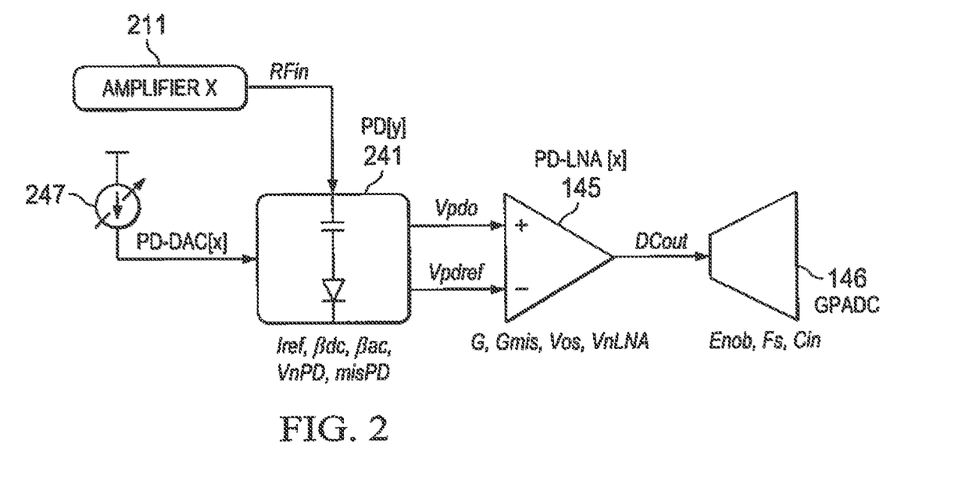
FIGS. 2 and 3 are a more detailed block diagram and a schematic of a peak voltage detector used in the transceiver of FIG. 1.
Figure 3:
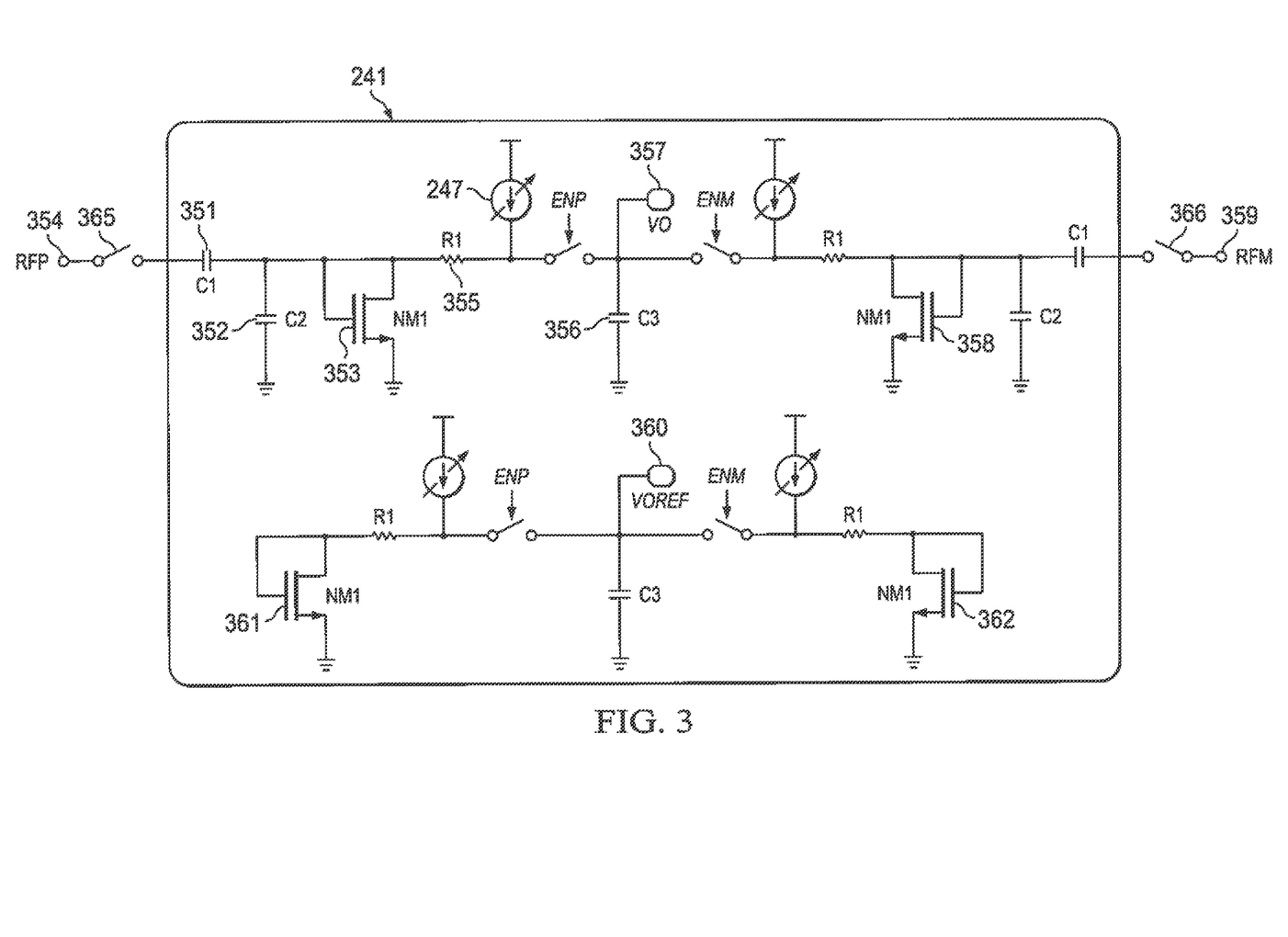

FIGS. 2 and 3 are a more detailed block diagram and a schematic of an exemplary peak voltage detector 241 that may be used in the transceiver of FIG. 1. PD 241 may be representative of each of the PDs 141-143, etc., referring back to FIG. 1. As mentioned above, PDs may be placed at the output of each mm-Wave amplifier in a pseudo differential fashion. Exemplary amplifier 211 is representative of the various amplifiers 111-113, 121-123, etc.

PD 241 is a square-law device biased in weak-inversion that converts the RF RMS (root mean square) voltage applied to diode connected NMOS device 353 to peak DC (direct current) voltage. The basic operation of square law detectors is well known. The DC component of the diode output is proportional to the square of the RF input voltage and to a responsivity that depends on the type of diode, the process and temperature. The measured output DC output voltage is then proportional to the input RF power, based on the impedance of the signal path.

In example PD 241, a capacitive divider 351, 352 attenuates an incoming signal received from amplifier 211 on input 354 within the linear range of detector 241. A low-pass filter formed by resistor 355 and capacitor 356 may remove spurious harmonics before the peak signal provided on output 357 is amplified by low noise amplifier 145 and provided to the input of the ADC 146. A similar topology is provided for pseudo-differential input 359 using diode connected device 358. A differential set of diode connected NMOS devices 361, 362 provide a reference voltage Vo-ref on output 360. As will be discussed in more detail below, a voltage measuring across output 357 and reference output 360 will be referred to as $\Delta V_{DC}$.

Figure 4:
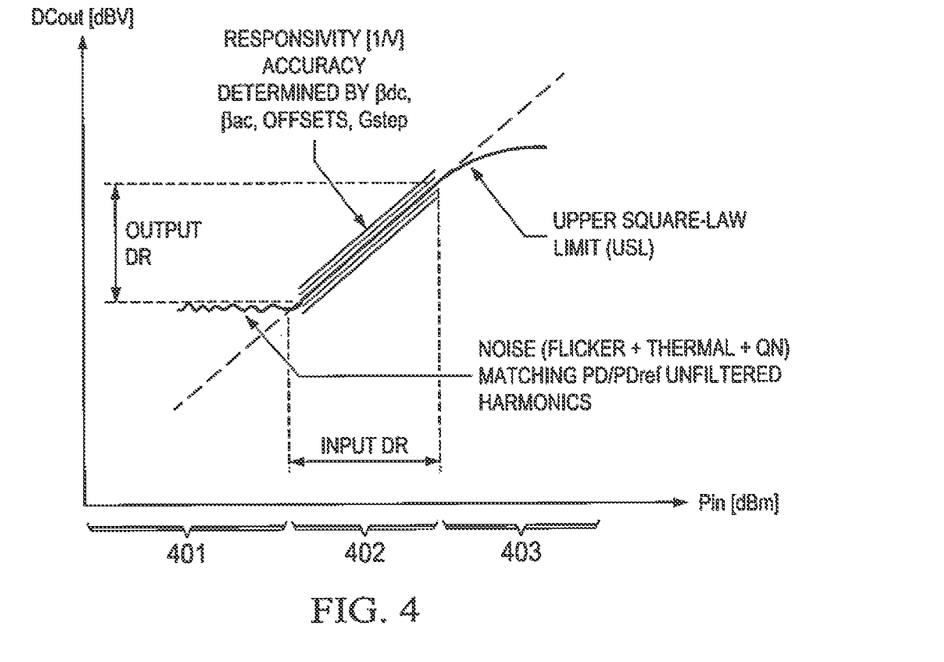
FIG. 4 is a plot illustrating an example response curve for the voltage detector of FIG. 2.

FIG. 4 is a plot illustrating an example response curve for the exemplary voltage detector of FIG. 2. The 79 GHz to DC responsivity of PD 241 may be given by the expression (1).

$$\beta_{79G} = \frac{\Delta v_{dc}}{(v_{RF,rms})^2} = -\beta_0 \cdot \beta_{ac} \cdot \beta_{nl} \quad (1)$$

where $\beta_0$ is proportional to the second order derivative of the IV (current-voltage) diode square-law relation and can be referred to as the DC responsivity which depends on process and temperature variations; $\beta_{ac}$ captures the responsivity frequency dependence in linear region 402, and $\beta_{nl}$ models the upper-square-law region 403 where higher order harmonics tend to compress the in/out characteristic. The bottom part 401 of the PDs dynamic range will be ultimately limited by noise, mismatch, and spurious harmonics.

Calibration

A calibration/trimming strategy that allows tracking and compensation for such unavoidable variations will now be described. It is possible to capture most non-idealities and achieve the desired accuracy by relying on a 3-step process. First, a DC IV (current-voltage) calibration step involves sweeping the PD biasing current by means of a current DAC (digital to analog converter). Referring again to FIGS. 2 and 3, DAC 247 may be used for this purpose. By capturing the input current vs. output voltage characteristic of each diode 353, 358 with a sufficient number of points, the IV exponential diode characteristic I=f(V) may be properly reconstructed at any given process corner and temperature. A regression of the measured points may be used to capture such variations in the DC responsivity as indicated by expression (2).

$$\beta_0 = \frac{1}{2} \cdot \frac{f''}{f'} = \frac{q}{2 \cdot n \cdot k \cdot T} \quad (2)$$

where q is the electron charge, n is the non-ideality coefficient, k is the Boltzmann constant, and T is the absolute temperature in Kelvin.

In a second step, a multipoint "trim" may be performed during final testing of the device when it is manufactured. Alternatively, this trim step may be performed at a later time, such as after the device is installed in a system, for example. This trim step provides improved absolute accuracy. The results may be stored in a static memory for use during operation of the device. For example, the results may be stored by blowing a set of fuses that are located on device 100, or by storing the results in a read only memory (ROM) or other type of non-volatile memory located on device 100.

In order to simplify this calibration step, the trim may be performed using a lower frequency signal, such as one that is in the range of 1-10 GHz. The underlying assumption is that the diode connected NMOS devices are wideband and that the 1 GHz versus 80 GHz responsivity will differ by a constant multiplying factor ρ that has a negligible dependence on process, temperature, and mismatch. This calibration step applies multiple input power points (whose corresponding voltage is $v_{RF,trim}$) and computes a trimming coefficient vector represented by expression (3). Typically, four or more input points should be performed to obtain satisfactory results.

$$\beta_{trim} = \rho \cdot \frac{\Delta v_{0,trim}}{\beta_0 \cdot (v_{RF,trim})^2} \quad (3)$$

β0 is computed from β0=1⁄2·f″f′=q⁄2·n·k·T) and Δv0,trim is the measured DC voltage at the PD output when applying $v_{RF,trim}$. $\beta_{ac}$ and $\beta_{nl}$ may be computed by interpolation of $\beta_{trim}$ in the PD linear region 402 and non-linear region 403 respectively.

In a third step, RF correlated double-sampling (CDS) may be performed. This step may provide improved precision when sensing voltages that are close to the PD sensitivity level in region 401, referring again to FIG. 4. This step may be performed by sampling the PD output with and without an RF signal present at its input within a short time interval and subtracting the two measurements. Depending on the separation in time between the two samples, the CDS may be full or soft. When subtracting the two samples taken at a short time interval, the effect of CDS on the peak-detector offset and noise is very similar to that of an auto-zeroing process. The transfer function imposes a zero at the origin of frequency that cancels any offset and strongly reduces the 1/f noise. When the time interval increases, the two samples will be less correlated and noise filtering will be less pronounced. On the other hand, the offset error will be still compensated (soft CDS). During the CDS routine, the optimal PD-LNA gain may be estimated. When using full CDS, the routine may use a gain control algorithm for the PD-LNA 145 that allows a maximization of the SNR at the output while not clipping the input to GPADC 146.

In the embodiment of FIG. 3, switches 365, 366 may be used to disconnect the RF input signal, for example. In this manner, correlated slow-varying noise contributions may be cancelled out. In practice, CDS creates a high-pass transfer function that improves the SNR (signal to noise ratio).

Measurements Results

Figure 5:
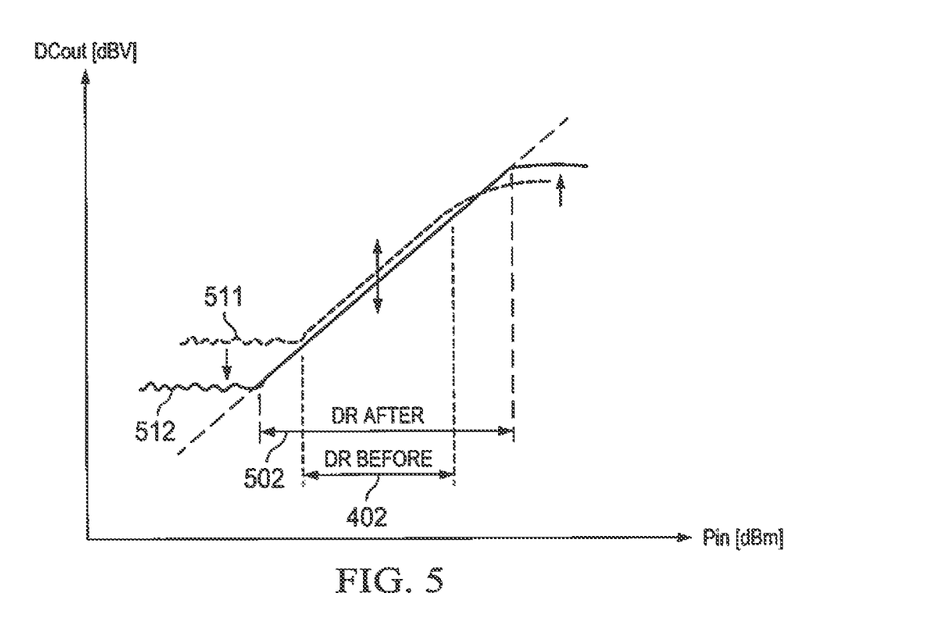
FIGS. 5-6 are plots illustrating a calibrated response curve for the peak detector of FIG. 2.
Figure 6:
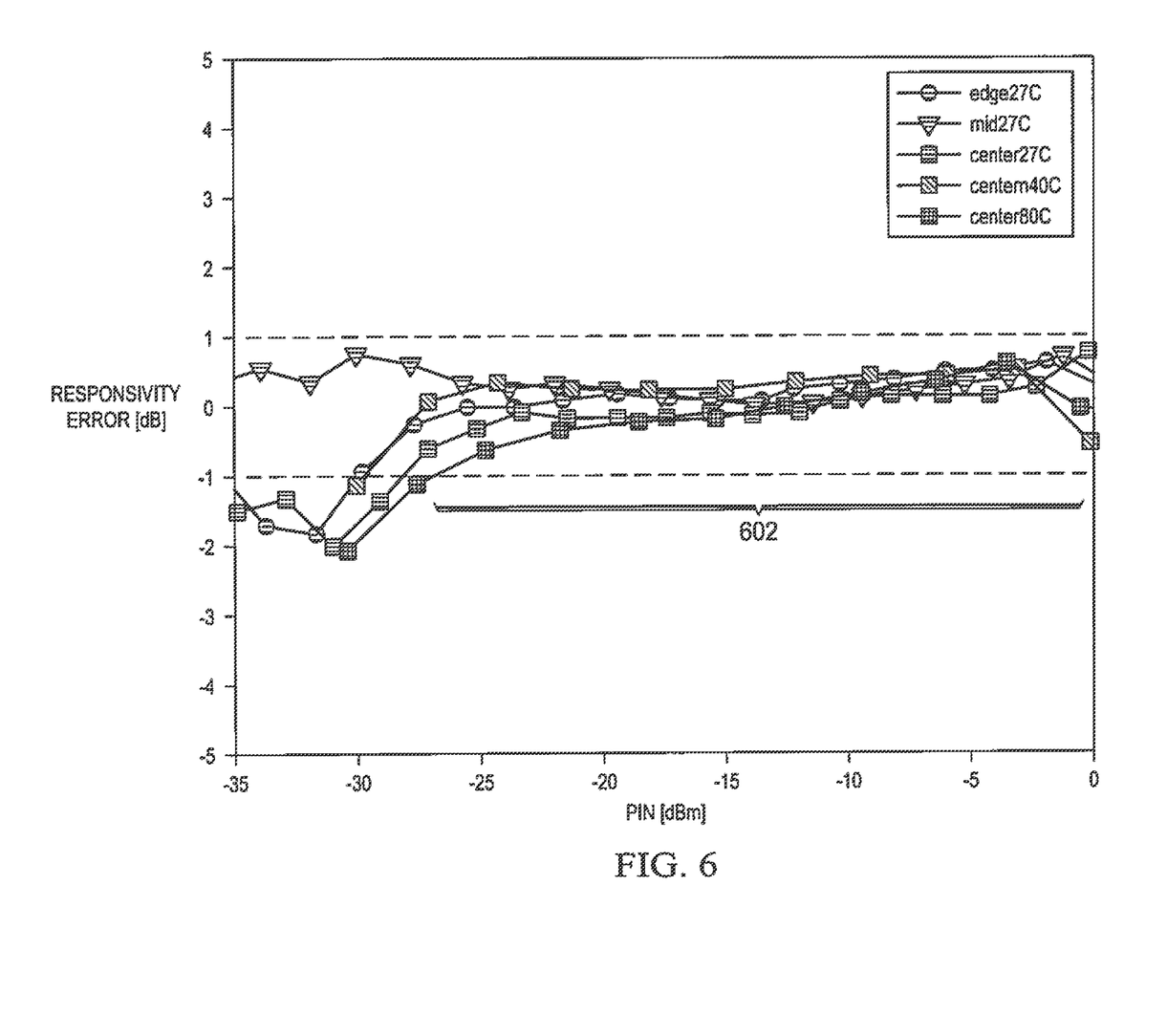

FIGS. 5-6 are plots illustrating an example calibrated response curve for the peak detector of FIG. 2. A test device was fabricated using a CMOS 45 nm technology and the calibration techniques described above were applied to them. In FIG. 5, plot line 511 represents raw readings taken from the test device, while plot line 512 illustrates the result of applying the calibration described above to the raw readings. The linear region 502 is expanded by the calibration process to cover a wider dynamic range (DR). FIG. 6 illustrates the calibrated Peak-Detector absolute responsivity error for different temperature and several devices located in different places on the test IC that was achieved using the three step process described above. A worse case error of 1 dB over a 27 dB dynamic range 602 is illustrated.

Calibration Process

Figure 7:
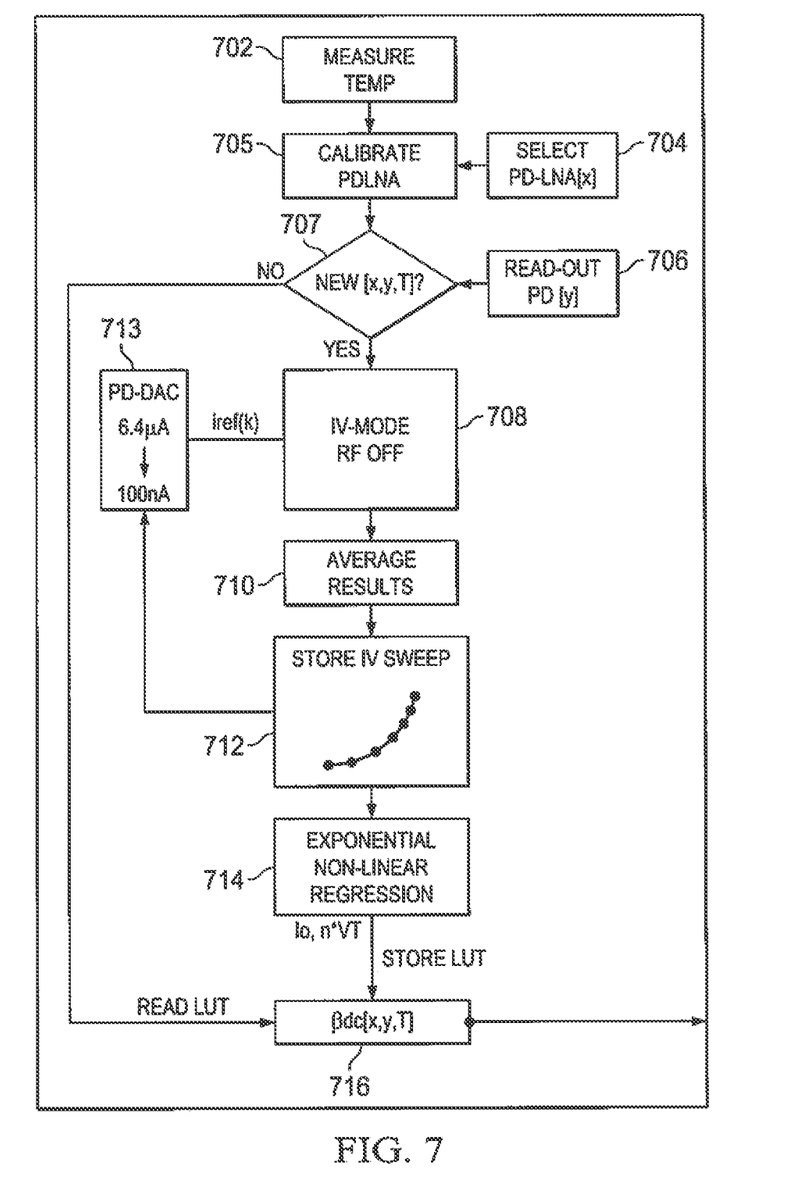
FIGS. 7-9 are flow diagrams illustrating calibration of the peak detector of FIG. 2.
Figure 8:
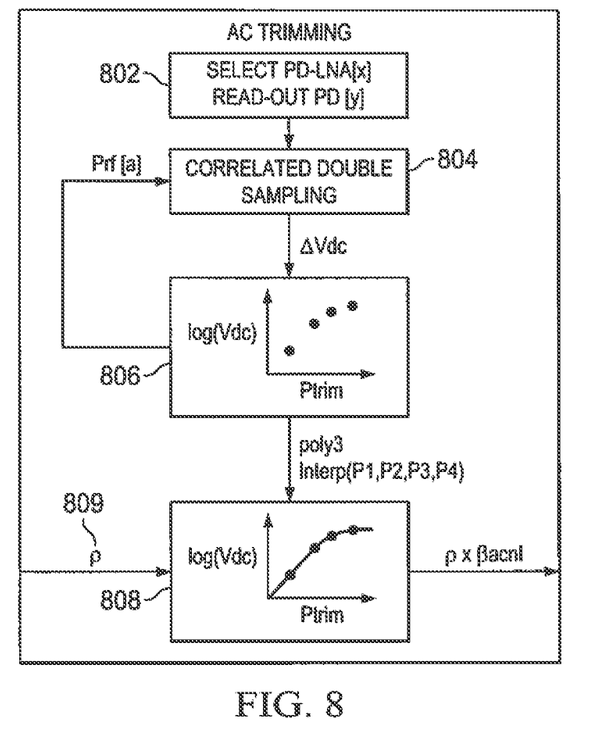
Figure 9:
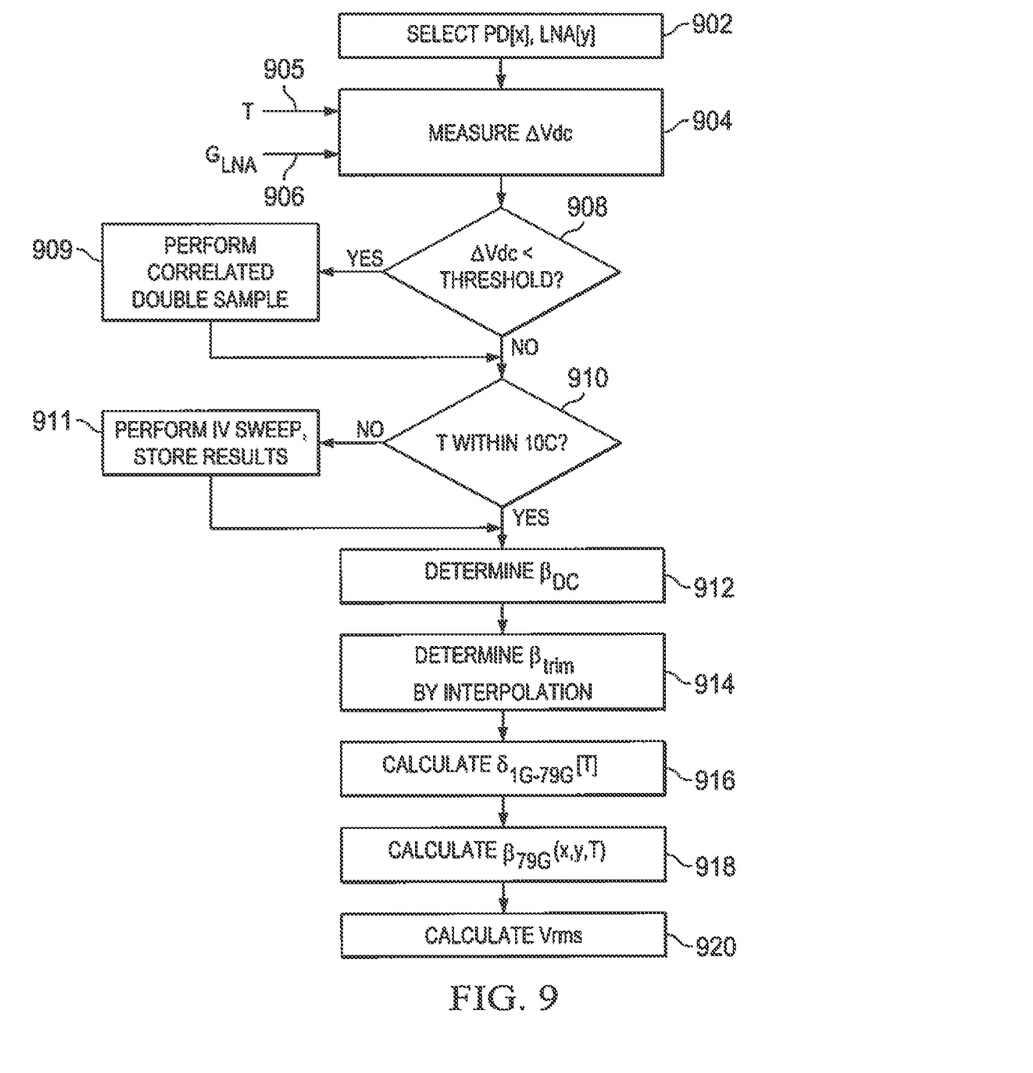

FIGS. 7-9 are flow diagrams illustrating in more detail the calibration steps described above. FIG. 7 illustrates the DC IV sweep process. In this example, the $\beta_{DC}$ coefficient, also referred to as the $\beta 0$ coefficient, is determined using sixty four current steps provided by DAC 247, referring again to FIG. 2. In other embodiments, more or fewer current steps may be used. The temperature of the IC is measured 702 using an on-chip temperature sensor. The measured temperature may be stored in a memory circuit located on the IC. In this example, the temperature is rounded to the nearest 10 degrees C. In this embodiment, a single temperature is measured. In other embodiments, there may be several temperature sensors scattered around the IC and each PD may be associated with a nearby temperature sensor, for example.

In this embodiment, there are several PD-LNAs 145, referring again to FIG. 1. Depending on which PD is to be operated on, a corresponding PD-LNA 145 is selected 704 and calibrated 705. The index "x" identifies the selected PD-LNA. The target PD is then selected 706 and enabled for reading by turning on the ENP and ENM switches, referring again to FIG. 3. The index "y" identifies the selected PD.

If the temperature associated with the selected PD has not changed more than 10 degrees C. 707 from the last IV sweep, then the results from the last IV sweep 716 may be used. Otherwise, the IV sweep process continues by placing the selected PD in an "IV sweep mode" 708 in which the RF input is turned off and the current DAC 247 is turned on.

For each current step 713, multiple output voltage measurements are made and the results are averaged 710 and then stored 712 to form a table of 64 IV results.

Once the data is collected, a regression is performed 714 to fit the data to a function. In this embodiment, a non-linear exponential regression is performed based on expression (4) to find "n(x,y,T)" and "$i_0$(x,y,T)", where $i_D$ is the sweep current and $V_{PD}$ is the measured output voltage at each step.

$$i_D = i_0 \cdot e^{\frac{v_{pd}}{n \cdot V_T}} \quad (4)$$

The $\beta_{DC}$ coefficient may then be determined 716 using expression (5).

$$\beta_{dc}(x, y, T) = -\frac{1}{2 \cdot n(x, y, T) \cdot V_T(x, y, T)} \quad (5)$$

FIG. 8 illustrates the process of AC trimming described above in more detail. As discussed above, the AC trimming process only needs to be performed once, typically at final test during the fabrication of the IC. The results of the trimming process may then be stored in non-volatile storage located on the IC for use during operation of the IC. An RF power source and a power meter that can accurately determine a test power at several power levels may be used to perform the calibration. A dedicated or a shared pin may be provided on the IC package for providing a test RF signal to the BIST network, for example.

In this embodiment, four power levels are used, however in other embodiments more or fewer power levels may be used for the calibration process. In this embodiment, the high power PDs are calibrated using input power settings of −11 dBm, −5 dBm, 1 dBm, and 7 dBm. Low power PDs are calibrated using input power settings of −22 dBm, −13 dBm, −7 dBm, and −1 dBm. As discussed above, the calibration RF signals may be in the range of 1-10 GHz. Alternatively, calibration may be performed at the full operation frequency in the range of 76-81 GHz. A constant "ρ" may be determined to convert calibration results done at 1-10 GHz to operation at 79-81 GHz by performing one sample at 79 GHz, for example.

A target PD and PD-LNA are selected 802. For each input power level, a correlated double sampling is performed 804 to minimize noise effects. The result is referred to as "ΔVdc". As mentioned above, in this embodiment four levels of RF power are used for each PD.

For each of the four ΔVdc results, a $\beta_{trim}$ coefficient is calculated 808 using expression (3) using constant ρ. The four $\beta_{trim}$ coefficients are then stored in non-volatile storage on the IC.

Referring back to expression (1), the $\beta_{ac}$ coefficient and $\beta_{nl}$ coefficient are obtained by polynomial interpolation in the linear region 402 and non-linear region 403, respectively, referring again to FIG. 4.

FIG. 9 illustrates the final process for determining an RF power value based on the raw measured $\Delta V_{DC}$ value from a selected PD and PD-LNA 902. For each measurement 904, the current temperature of the IC, or the region of the IC near the selected PD, is determined 905 from the on-chip temperature sensor. Also, the gain of the selected LNA 145 provided 906. A correlated double sample (CDS) 909 may be performed when the measured $\Delta V_{DC}$ value is below a threshold value 908 that indicates the measured peak voltage is in the noisy region 401, referring again to FIG. 4. Alternatively, a CDS 909 may be performed for every measurement, for example.

As long as the temperature is within ten degrees 910 of the last IV sweep, then the stored $\beta_{DC}$ constant may be retrieved 912 from non-volatile memory that is on the IC. If there is more than a ten degree difference, then a new IV sweep may be performed and the results are stored in non-volatile memory 904.

The set of four $\beta_{AC}$ coefficients are then retrieved 914 from non-volatile memory 904 and an interpolation is performed based on the raw $\Delta V_{DC}$ value to determine a $\beta_{AC}$ coefficient to use with the raw $\Delta V_{DC}$ value.

The $\rho$ coefficient, also referred to as the "$\delta_{1G-79G}[T]$" coefficient may also be retrieved from non-volatile memory. The $\rho$ coefficient captures the delta coefficient between the PD operating at 79 GHz versus the actual low-cost trimming procedure at 1-10 GHz. The temperature dependence of this parameter may be captured through stand-alone PD simulations/measurements and may be normalized 916 to the Trim temperature. Table 1 summarizes the coefficient over temperature for device 100.

TABLE 1

Temperature dependence of AC parameters

| | | |
|---|---|---|
| −40 | 1.00 | 1.00 |
| −30 | 1.00 | 1.01 |
| −20 | 0.99 | 1.03 |
| −10 | 0.99 | 1.05 |
| 0 | 0.97 | 1.07 |
| 10 | 0.96 | 1.09 |
| 20 | 0.94 | 1.11 |
| 25 | 0.93 | 1.12 |
| 26 | 0.92 | 1.12 |
| 27 | 0.92 | 1.13 |
| 40 | 0.89 | 1.16 |
| 50 | 0.86 | 1.19 |
| 60 | 0.82 | 1.23 |
| 70 | 0.78 | 1.26 |
| 80 | 0.74 | 1.30 |
| 90 | 0.70 | 1.35 |
| 100 | 0.64 | 1.40 |
| 110 | 0.59 | 1.46 |
| 125 | 0.49 | 1.56 |
| 130 | 0.46 | 1.60 |
| 140 | 0.39 | 1.68 |

Once all of the coefficients are collected, $\beta_{79G}$ may be calculated 918 as indicated in expression (1). A more detailed expression for $\beta_{79G}$ is provided by expression (6).

$$\beta_{79G}(x, y, T, :) = \beta_{dc}(x, y, T) \cdot \left\{ \beta_{ac,1G} - \frac{[\beta_{ac,1G} - \beta_{acnl,1G}(:)]}{nlTtrim(T)} \right\} \cdot \delta_{1G-79G}(T) \cdot G_{LNA} \quad (6)$$

where $\beta_{acnl,1G}(:)$ is a vector result of the AC 1 GHz trimming.

Once the $\beta_{79G}(x,y,T)$ coefficient is determined, the actual RMS voltage value may then be calculated 920 using expression (1), which may be rewritten as expression (7). This calculated result may then be provided 910 to an upper level control system as the final $V_{RMS}$ result.

$$v_{RF,rms}[x, y, T] = \sqrt{\left| \frac{\Delta v_{dc0}(x, y)}{\beta_{79G}(x, y, T)} \right|} \quad (7)$$

In review, as described above in more detail, after a wafer containing ICs that each have a mm-wave transceiver with a set of PVDs (peak voltage detectors) has been fabricated, it is sliced and packaged and then final tested. During final testing of each IC, a four-point (or more) test may be performed in which four or more measurements are taken of one (or more) PVDs using a microwave <10 GHz RF source at four or more power levels. The resulting set of PVD outputs are recorded in a non-volatile memory on the IC.

After the IC is installed in a system, each time it is powered on, a DC current/voltage (IV) calibration will be performed by doing a sweep of currents using a programmable DAC and measuring the PD output voltage while the RF input is turned off, as described in more detail with regards to FIG. 7. The chip temperature may be measured using an on-chip temp sensor. A regression is performed using the measured PD output values to derive a value for "n" and "i0" in equation (4). In this example, a non-linear regression is performed, which is a statistical method that interpolates a known non-linear function which in this example is equation (4), where Id is the sweep current, Vpd is the correspondent DC voltage measured at the output, Vt=kT/q, and n and i0 are the variables that are fit through the numerical interpolation process. Once the coefficient "n" is determined, $\beta_0$ may be computed using equation (5) where q and k are constants, T is the measured temperature and n is the result of the interpolation.

During operation of the chip, a value for $\beta_{trim}$ is calculated using the stored values from the four point calibration and the current value of $\beta_0$ derived from equation (5) based on the value "n", i0 and Vt.

The temperature of the IC is monitored using the temp sensor. Whenever the temperature varies by more than 10 C during operation, a new DC IV sweep calibration may be performed to determine a new value of "n", i0 and Vt.

Each time an RF voltage measurement is done at either microwave or mm-wave frequencies, the PVD output value ($\Delta$vdc) is read by a control processor in the system and then a corresponding Vrms value may be determined using equation (6) and equation (7).

When a reading is taken that corresponds to the lower region of the PVD response curve, a second measurement may be taken with the RF input turned off (i.e., quiescent). This measurement is subtracted from the RMS reading to minimize noise. Noise is only canceled if the second reading is taken within a short time t2<$\tau$ interval. The longer $\tau$, the lower will be the noise correlation and the effectiveness of the noise canceling. However, if the second measurement is taken at t2>>$\tau$, offset errors may still be canceled.

Figure 10:
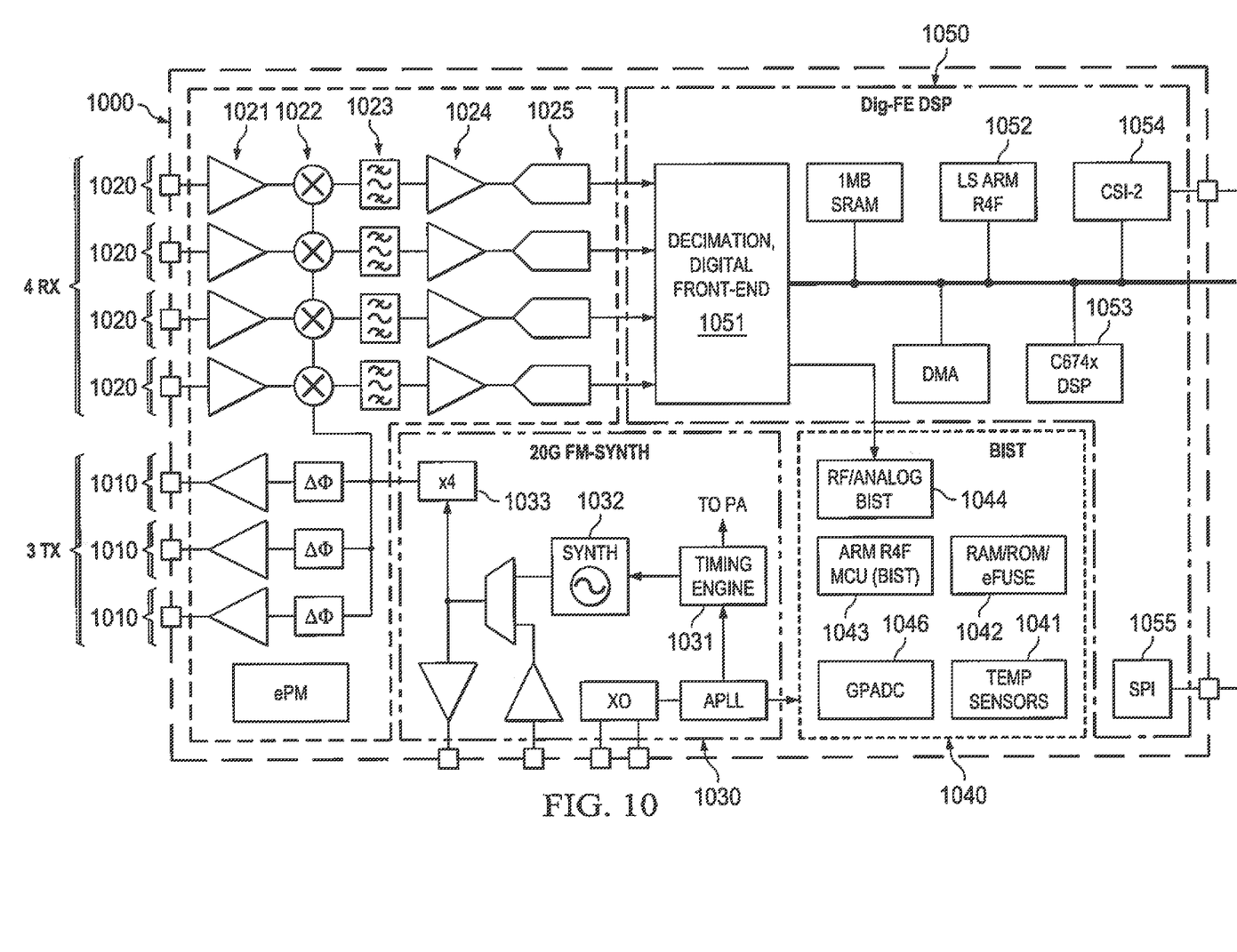
FIG. 10 is a block diagram of a radar system integrated circuit that includes multiple radar transmitters and receivers.

FIG. 10 is a block diagram of a radar system SOC 1000 that may include multiple radar transmitters and receivers similar to device 100, referring again to FIG. 1. The radar SOC 1000 may include multiple transmit channels 1010 for transmitting FMCW (frequency modulated continuous wave) RF signals and multiple receive channels 1020 for receiving the reflected transmitted signals. Further, the number of receive channels may be larger than the number of transmit channels. For example, an embodiment of the radar SOC 1000 may have three transmit channels and four receive channels.

A transmit channel includes a suitable transmitter and antenna. A receive channel includes a suitable receiver and antenna. Further, each of the receive channels 1020 may be identical and include a low-noise amplifier (LNA) 1021 with one or more stages to amplify the received signal, a mixer 1022 to mix the signal generated by the transmission generation circuitry with the received signal to generate an IF signal, a baseband bandpass filter 1023 for filtering the IF signal, a variable gain amplifier (VGA) 1024 for amplifying the filtered IF signal, and an analog-to-digital converter (ADC) 1025 for converting the analog IF signal to a digital IF signal. The mixer serves as a down converter that generates an output signal with a frequency equal to the difference between the frequency of the inputs received from the low-noise amplifier and the transmission generation circuitry, both of which are radio frequency (RF) signals. The bandpass filter, VGA, and ADC of a receive channel may be collectively referred to as a baseband chain or baseband filter chain. Further, the bandpass filter and VGA may be collectively referred to as an IF amplifier (IFA).

The receive channels 1020 are coupled to a digital front end (DFE) decimation component 1051 to provide the digital IF signals to the digital control module 1050. The DFE 1051 includes functionality to perform decimation filtering on the digital IF signals to reduce the data transfer rate. A processor 1052 and/or a signal processor 1053 in control module 1050 may also perform other operations on the digital IF signals, e.g., DC offset removal, digital compensation of non-idealities in the receive channels, such as inter-RX gain imbalance non-ideality, inter-RX phase imbalance non-ideality and the like. The control module 1050 may be coupled to a high speed serial interface (I/F) 1054 to transfer decimated digital IF signals to a processing unit that may be located in another IC, for example, when the radar SOC 1000 is in normal mode. The control module may also be coupled to the built in self test (BIST) module 1040 to transfer digital test signals to the BIST module 1040 when the radar SOC 1000 is in test mode.

A serial peripheral interface (SPI) 1055 may provide an interface for communication with the processing unit located in another IC. For example, the processing unit may use the SPI 1055 to send control information, e.g., timing and frequencies of chirps, output power level, triggering of monitoring functions, etc., to the control module DFE. The radar SOC 1000 may use the SPI 1055, for example, to send test data to the processing unit.

The control module 1050 includes functionality to control the operation of the radar SOC 1000 in normal mode and in test mode. The control module 1050 may include, for example, a buffer to store output samples of the DFE 1051, an FFT (Fast Fourier Transform) engine to compute spectral information of the buffer contents, and an MCU that executes firmware to control the operation of the radar SOC 1000 in normal mode and in test mode.

A 20 GHz frequency modulation synthesizer (FM-Synth) module 1030 generates the RF signals that are then multiply by four and provided to the transmitter channels. The programmable timing engine 1031 includes functionality to receive chirp parameter values for a sequence of chirps in a radar frame from the control module 1050 and to generate chirp control signals that control the transmission and reception of the chirps in a frame based on the parameter values. The chirp parameters are defined by the radar system architecture and may include, for example, a transmitter enable parameter for indicating which transmitters to enable, a chirp frequency start value, a chirp frequency slope, a chirp duration, indicators of when the transmit channels should transmit and when the DFE output digital should be collected for further radar processing, etc. One or more of these parameters may be programmable.

The radio frequency synthesizer (SYNTH) 1032 includes functionality to generate FMCW (frequency modulated continuous wave) signals for transmission based on chirp control signals from the timing engine 1031. In some embodiments, the SYNTH 1032 may include a phase locked loop (APLL) with a voltage controlled oscillator (XO).

The clock multiplier 1033 increases the frequency of the transmission signal (LO signal) to the LO frequency of the mixers 1022. The clean-up PLL (phase locked loop) operates to increase the frequency of the signal of an external low frequency reference clock (not shown) to the frequency of the SYNTH 1032 and to filter the reference clock phase noise out of the clock signal.

The clock multiplier 1033, synthesizer 1032, timing generator 1031, and clean up PLL are an example of transmission generation circuitry. The transmission generation circuitry generates a radio frequency (RF) signal as input to the transmit channels and as input to the mixers in the receive channels via the clock multiplier. The output of the transmission generation circuitry may be referred to as the LO (local oscillator) signal or the FMCW signal.

The BIST circuitry 1040 includes one or more temperature sensors 1041, dynamic and non-volatile memory 1042, a processing engine 1043, ADC 1046, and various RF/analog components, such as a set of peak detectors as described above in more detail. Processing engine 1043 is configured to perform the processing described above with regard to FIGS. 7-9 by executing instructions stored in memory 1042, receiving measured voltage information from the set of PDs 1044 via ADC 1046, and accessing coefficient data stored in memory 1042.

Figure 11:
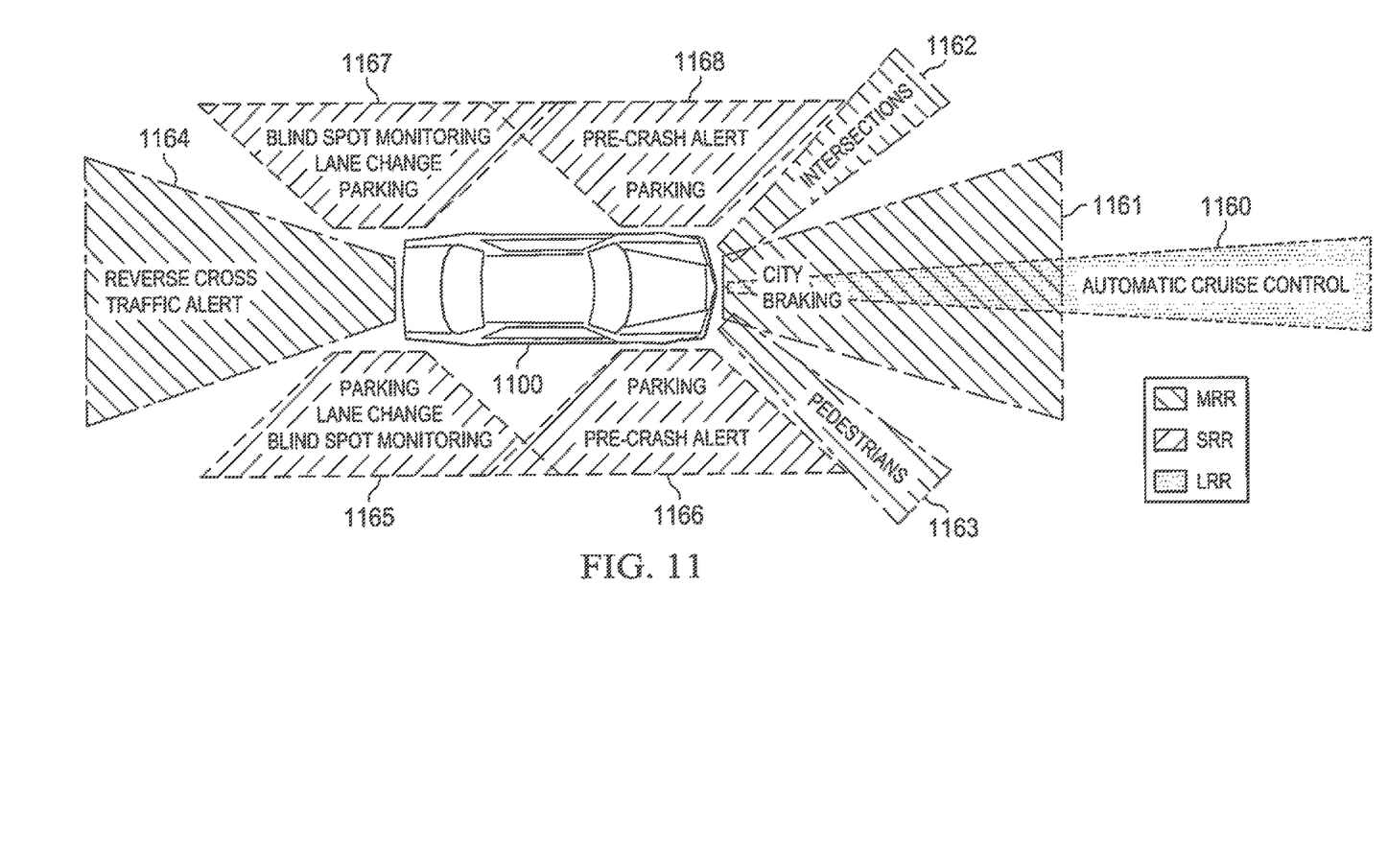
FIG. 11 is an illustration of an automobile equipped with multiple radar systems.

FIG. 11 is an illustration of an automobile 1100 equipped with multiple radar systems, as described herein in more detail. Long range radar (LRR) may be used for applications such as automatic cruise control 1160. Medium rang radar (MRR) typically use a narrow beam and must detect high relative velocities. MRR may be used for applications such as: braking 1161, intersection detection 1162, pedestrian detection 1163, and reverse cross traffic alerts 1164, for example. Short range radar (SRR) typically uses a wide beam with large angular separation to provide good distance resolution. SRR may be used for applications such as: parking lane change and blind spot monitoring 1165, 1167, and pre-crash alerts and parking 1166, 1168, for example.

A set of radar SOCs, such as radar SOC 1000, may be deployed around auto 1100 to provide object detection for the applications mentioned above. As such, each of the radar SOCs may be monitored by BIST logic as described above in more detail in order to provide a level of safety required in automotive applications.

As described above in more detail, embodiments of this disclosure provide peak detector simplicity, small area, and low current consumption. The simple PD topology may be used and it may be replicated hundreds of times throughout a chip without affecting the RF performance.

The calibration techniques disclosed herein may provide robustness across process corners, supply voltage and reference current variations, temperature, global and local mismatches, for example. Dynamic range extension may be provided through non-linearity compensation, on one side of the diode curve, and noise floor, offset and mismatches reduction on the other side.

Other Embodiments

While the disclosure has been described with reference to illustrative embodiments, this description is not intended to be construed in a limiting sense. Various other embodiments of the disclosure will be apparent to persons skilled in the art upon reference to this description. For example, while radar systems that operate in the 76-81 GHz band were described herein, other embodiments may operate in RF bands that are higher or lower than this range.

While non-linear regression was utilized herein to quantify the results of the IV sweep, in other embodiments a linear regression, or even a simple table may be used to quantify the results, for example.

In embodiments described herein, a new IV sweep is performed when the temperature varies by more than 10 C. In another embodiment, a higher or lower threshold may be used, depending on the accuracy required by the application, for example.

The techniques described in this disclosure may be implemented in hardware, software, firmware, or any combination thereof. If implemented in software, the software may be executed in one or more processors, such as a microprocessor, application specific integrated circuit (ASIC), field programmable gate array (FPGA), or digital signal processor (DSP). The software that executes the techniques may be initially stored in a computer-readable medium such as compact disc (CD), a diskette, a tape, a file, memory, or any other computer readable storage device and loaded and executed in the processor. In some cases, the software may also be sold in a computer program product, which includes the computer-readable medium and packaging materials for the computer-readable medium. In some cases, the software instructions may be distributed via removable computer readable media (e.g., floppy disk, optical disk, flash memory, USB key), via a transmission path from computer readable media on another digital system, etc.

Certain terms are used throughout the description and the claims to refer to particular system components. As one skilled in the art will appreciate, components in digital systems may be referred to by different names and/or may be combined in ways not shown herein without departing from the described functionality. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" and derivatives thereof are intended to mean an indirect, direct, optical, and/or wireless electrical connection. Thus, if a first device couples to a second device, that connection may be through a direct electrical connection, through an indirect electrical connection via other devices and connections, through an optical electrical connection, and/or through a wireless electrical connection.

Although method steps may be presented and described herein in a sequential fashion, one or more of the steps shown and described may be omitted, repeated, performed concurrently, and/or performed in a different order than the order shown in the figures and/or described herein. Accordingly, embodiments of the invention should not be considered limited to the specific ordering of steps shown in the figures and/or described herein.

It is therefore contemplated that the appended claims will cover any such modifications of the embodiments as fall within the true scope and spirit of the invention.

What is claimed is:

1. A method comprising:
    performing a current-voltage sweep on the peak voltage detector to determine a first coefficient;
    measuring a peak voltage produced by the peak voltage detector in response to a high frequency radio frequency (RF) signal to obtain a first measured voltage;
    determine a second coefficient using calibration data, wherein the calibration data is produced by performing an alternating current (AC) calibration with a test signal on the peak voltage detector; and
    calculating an approximate power of the RF signal by adjusting the first measured voltage using the first and second coefficients.

2. The method of claim 1, further including:
    measuring a second peak voltage produced by the peak voltage detector in response to a quiescent input to produce a second measured voltage;
    subtracting the second measured voltage from the first measured voltage to produce a double sampled measured voltage; and
    in which the double sampled measured voltage is used in place of the first measured voltage to calculate the approximate power of the RF signal.

3. The method of claim 2, in which measuring the second peak voltage is only performed when the first measured voltage is below a threshold value.

4. The method of claim 1, further including measuring a temperature representative of the peak voltage detector and storing the measured temperature along with the first coefficient; and
    in which the current-voltage sweep is performed only when a current temperature differs from the stored temperature by more than a range value, otherwise using the stored first coefficient for as long as the temperature remains within the range value of the stored temperature.

5. The method of claim 4, in which the range value is 10 C.

6. The method of claim 1, in which performing each test point of the AC calibration test includes:
    providing a test radio frequency (RF) signal having a known frequency and a known power level to the peak voltage detector;
    measuring a resultant peak voltage;
    calculating a calibration coefficient that relates the peak voltage to the test RF signal; and
    storing the calibration coefficient in a non-volatile storage location on the integrated circuit.

7. A method comprising:
    providing a plurality of diode based mm-wave peak voltage detectors (PVD) on the integrated circuit (IC);
    performing a current-voltage sweep on a PVD of the plurality of PVDs to determine a first coefficient;
    performing an alternating current (AC) calibration test using one or more test points on a first selected PVD of the plurality of PVDs to determine a set of one or more second coefficients, in which for each test point the method includes:
    providing a radio frequency (RF) test signal having a known frequency and a known power level to the selected PVD;
    measuring a resultant peak voltage;
    calculating an AC calibration coefficient that relates the peak voltage to the RF test signal; and
    storing the AC calibration coefficient in a non-volatile storage location on the integrated circuit.

8. The method of claim 7, in which the known frequency of the AC calibration test is less than a high frequency operating frequency, further including:
    performing at least one high frequency calibration test on a second PVD using a test RF signal having a high frequency in an operating range of the IC;
    calculating a high frequency calibration coefficient that relates the peak voltage to the test RF signal;
    calculating a conversion factor ($\rho$) value that relates the AC calibration coefficient to the high frequency calibration coefficient; and storing the ρ value in another non-volatile memory location on the integrated circuit.

9. The method of claim 8, further including:
measuring a peak voltage produced by the second selected PVD in response to a high frequency radio frequency (RF) signal to obtain a first measured voltage; and
calculating an approximate power of the RF signal by adjusting the first measured voltage using the first coefficient, the second coefficients, and ρ.

10. The method of claim 9, further including:
measuring a second peak voltage produced by the second selected PVD in response to a quiescent input to produce a second measured voltage;
subtracting the second measured voltage from the first measured voltage to produce a double sampled measured voltage; and
in which the double sampled measured voltage is used in place of the first measured voltage to calculate the approximate power of the RF signal.

11. The method of claim 10, in which measuring a second peak voltage is only performed when the first measured voltage is below a threshold value.

12. The method of claim 9, further including measuring a temperature representative of the second selected PVD and storing the measured temperature along with the DC coefficient; and
in which the current-voltage sweep is performed only when a current temperature differs from the stored temperature by more than a range value, otherwise using the stored DC coefficient for as long as the temperature remains within the range value of the stored temperature.

13. The method of claim 12, in which the range value is 10 C.

14. A system on an integrated circuit comprising:
a plurality of mm-wave peak voltage detectors (PVD) formed on a substrate of the integrated circuit (IC), in which each of the plurality of PVDs has an input coupled to receive a mm-wave radio frequency (RF) signal, and in which each of the plurality of PVDs has an output for providing a measured peak voltage signal;
a built in self test (BIST) network coupled to read the measured peak voltage signal on the output of each of the plurality of PVDs, in which the BIST includes a processing module and a memory module having a non-volatile memory portion, in which the processing module is operable to:
perform a current-voltage sweep on a selected PVD to determine a first coefficient;
measure a peak voltage produced by the selected PVD in response to a mm-wave radio frequency (RF) signal to obtain a first measured voltage;
determine a second coefficient using calibration data, wherein the calibration data is produced by performing an alternating current (AC) calibration test using one or more known test signals on the peak voltage detector; and
calculate an approximate power of the RF signal by adjusting the first measured voltage using the first and second coefficients.

15. The system of claim 14, in which the processor module is further operable to:
measure a second peak voltage produced by the selected PVD in response to a quiescent input to produce a second measured voltage;
subtract the second measured voltage from the first measured voltage to produce a double sampled measured voltage; and
in which the double sampled measured voltage is use in place of the first measured voltage to calculate the approximate power of the RF signal.

16. The system of claim 15, in which measuring the second peak voltage is only performed when the first measured voltage is below a threshold value.

17. The system of claim 14, in which the processor is further operable to measure a temperature representative of the peak voltage detector and store the measured temperature along with the first coefficient in the memory module; and
in which the current-voltage sweep is performed only when a current temperature differs from the stored temperature by more than a range value, otherwise using the stored first coefficient for as long as the temperature remains within the range value of the stored temperature.

18. The system of claim 17, in which the range value is 10 C.

19. The system of claim 14, in which performing each test point of the AC calibration test includes:
providing a test radio frequency (RF) signal having a known frequency and a known power level to the peak voltage detector;
measuring a resultant peak voltage;
calculating a calibration coefficient that relates the peak voltage to the test RF signal; and
storing the calibration coefficient in a location in the non-volatile storage memory on the integrated circuit.

20. The system of claim 14, further including a plurality of mm-wave modules that each have an output coupled to an input of a respective one of the plurality of PVDs.

* * * * *